United States Patent [19]  
Bacuvier

[11] Patent Number: 4,949,147  
[45] Date of Patent: Aug. 14, 1990

[54] SENSITIVE THYRISTOR WITH INTEGRATED GATE-CATHODE DECOUPLING

[75] Inventor: Pierre Bacuvier, Luynes, France
[73] Assignee: Thomson-CSF, Paris, France
[21] Appl. No.: 253,927
[22] Filed: Oct. 7, 1988

Related U.S. Application Data

[63] Continuation-in-part of Ser. No. 892,913, Aug. 4, 1986, abandoned.

[30] Foreign Application Priority Data

Aug. 6, 1985 [FR] France ................... 85 12036

[51] Int. Cl.⁵ .......................................... H01L 29/74
[52] U.S. Cl. .......................................... 357/38; 357/55
[58] Field of Search ................. 357/38 A, 55, 38, 55

[56] References Cited

U.S. PATENT DOCUMENTS

| | | | |
|---|---|---|---|
| 3,771,029 | 11/1973 | Burtscher et al. | 357/38 |
| 3,970,843 | 7/1976 | Dumas | 357/38 |
| 4,314,266 | 2/1982 | Temple. | |
| 4,599,633 | 7/1986 | Thire et al. | 357/38 |
| 4,614,962 | 9/1986 | Bertotti et al. | 357/38 |
| 4,622,572 | 11/1986 | Temple | 357/38 |
| 4,791,470 | 12/1988 | Shinotte et al. | 357/38 |

FOREIGN PATENT DOCUMENTS

| | | |
|---|---|---|
| 0110551 | 6/1984 | European Pat. Off. . |
| 0143259 | 6/1985 | European Pat. Off. . |
| 2722064 | 10/1978 | Fed. Rep. of Germany . |
| 53-25386 | 3/1978 | Japan .............. 357/38 LA |
| 55-99773 | 7/1980 | Japan .............. 357/38 LA |

OTHER PUBLICATIONS

Patents Abstracts of Japan, vol. 5, No. 197 (E-86) [869], Dec. 15, 1981.
JP-A-56 116 666 (Nippon Denki K.K.), 12/09/1981.

Primary Examiner—Rolf Hille
Assistant Examiner—Steven Loke
Attorney, Agent, or Firm—Oblon, Spivak, McClelland, Maier & Neustadt

[57] ABSTRACT

So as to avoid untimely triggering of a sensitive thyristor, it is given the structure shown in the accompanying figure, with a passivated furrow SP3 which divides the gate layer P1 into two completely separate zones (zone B and zone C). Zone B comprises on the one hand the whole of the cathode region N1 and on the other a first surface portion P'1 of the P layer adjacent the furrow SP3. Zone C comprises on the one hand an auxiliary N type surface region N3 and on the other a second surface portion P''1 of the layer P1. The cathode metallization CME1 covers the cathode region N1 without covering the region P'1. The gate metallization MG covers at least partially the region P'1. An auxiliary metallization MA separate from the others covers the region P'1 and the region N3.

9 Claims, 2 Drawing Sheets

FIG_1
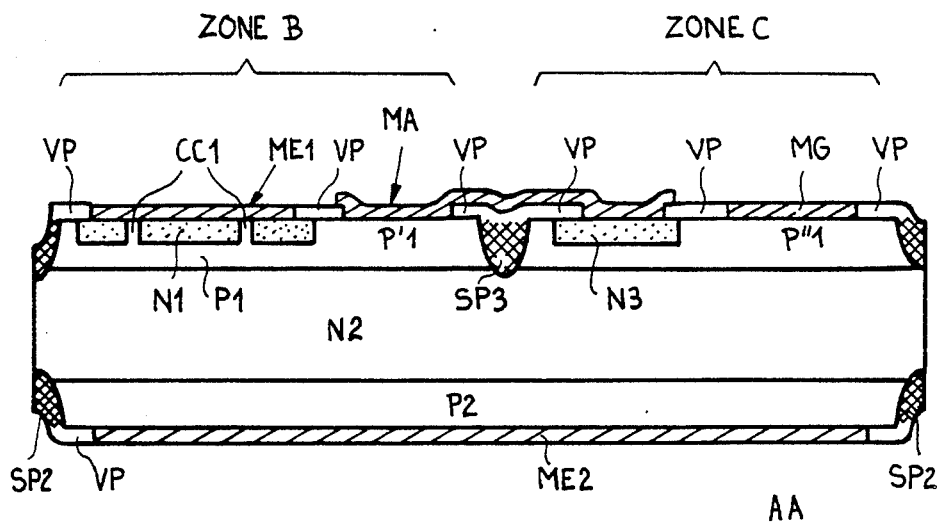
FIG_2
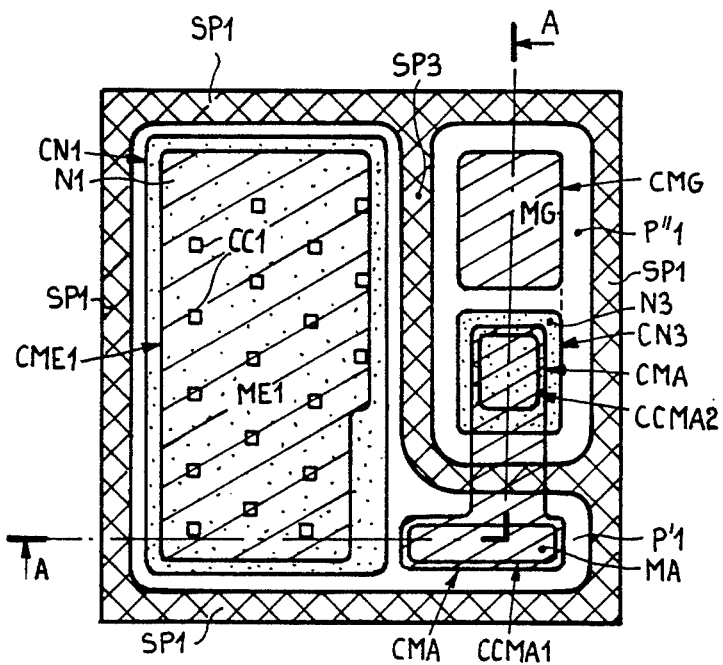

SENSITIVE THYRISTOR WITH INTEGRATED GATE-CATHODE DECOUPLING

This application is a Continuation-In-Part of application Ser. No. 892,913, filed on Aug. 4, 1986, now abandoned.

BACKGROUND OF THE INVENTION

The invention relates to thyristors and more particularly to sensitive thyristors, that is to say capable of being caused to conduct by a low gate current (typically less than 500 mA).

These thyristors have the advantage of requiring a low control power but this advantage may become a disadvantage to the extent that these thyristors risk being triggered prematurely by parasite currents even small ones.

In particular, sensitive thyristors very often have poor resistance to parasite currents generated in the semiconductor body in the presence of high voltage time gradients (high dV/dt) between anode and cathode: they also have poor temperature resistance, the generation of electronhole pairs due to the heat creating parasite currents capable of causing the thyristor to conduct.

To try to improve the resistance to premature triggering due to high dV/dt or due to the temperature, up to now solutions have been adopted which consist in adding between the gate and cathode a decoupling resistance external to the thyristor, or sometimes an external decoupling capacity or a combination of a resistance and a capacity.

The purpose of the resistance is to allow the gate region to recover capacitive currents due to the dV/dt or the thermal carrier generation currents without imposing a priori the injection of the gate-cathode junction but it reduces the sensitivity of the thyristor. However, even when the gate is connected, this resistance does not prevent a current path from being formed between the gate and the cathode which will be associated as a function of the dV/dt or of the temperature with an internal lateral current flow between the part situated under the cathode and the gate this lateral flow internal to the thyristor may cause triggering of the thyristor. This phenomenon is all the more critical the wider the cathode (powerful thyristors). It may be partially avoided by reducing the elementary cathode widths through interdigitation of the gate and the cathode but that assumes that there is interdigitation absolutely everywhere which does not allow widened cathode zones to be provided for making contact. The technology of mounting the electrodes is therefore made difficult.

The use of a capacity external to the thyristor, between gate and cathode, allows the parasite current generated by the dV/dt voltage gradients to be absorbed but it has no effect on the thermally generated carriers and in addition it introduces a tripping delay during voluntary enabling of the thyristor.

The present invention proposes a new sensitive thyristor structure which considerably improves the immunity to parasite triggering by anode-cathode voltage gradients (dV/dt) or by a temperature rise, and without using the conventional concept of interdigitation of the cathode.

SUMMARY OF THE INVENTION

The proposed structure is the following:

The thyristor comprises a semiconductor substrate having a rear face covered with an anode metallization and a front face comprising three separate metallizations which are respectively a cathode metallization, a gate metallization and an auxiliary metallization, the thyristor having under the metallizations of the front face a P type semiconductor layer in which are diffused N type regions which are respectively a cathode region and an auxiliary region of dimensions much smaller than the cathode region; the P type layer is divided into two zones filled by a passivation substance, a first one containing on the one hand the whole of the cathode region and on the other a first P layer portion flush with the surface of the substrate and adjacent the furrow, and a second zone containing on the one hand the auxiliary region and on the other a second P layer portion flush with the surface; the gate metallization covers at least partially the second P layer portion; the cathode metallization covers the cathode region without covering the first P layer portion; and the auxiliary metallization covers on the one hand the first P layer portion and on the other at least partially the auxiliary region.

This auxiliary metallization is preferably a continuous layer which passes above the passivated furrow where this furrow extends between the first P layer portion and the auxiliary region.

The auxiliary region is preferably not adjacent the furrow, like the cathode region moreover, this latter further having a distribution of small holes called emitter short circuit holes through which the P type layer rises to the surface; these short circuit holes are covered by the cathode metallization. This structure considerably improves the immunity of the thyristor to parasite triggering due to the voltage gradients dV/dt and due to the temperature.

In a variant, the P type layer is of planar type, that is to say that it is diffused locally; in this case, the passivated furrow is replaced by an uprise of the N type substrate on the front face this uprise being covered with an insulating passivation layer.

BRIEF DESCRIPTION OF THE DRAWINGS

Other features and advantages of the invention will appear from the detailed description which follows with reference to the accompanying drawings in which:

FIG. 1 shows a cross section through the broken line A—A of FIG. 2 of the thyristor of the invention;

FIG. 2 shows a top view of this thyristor where not only the N type regions of the upper face but also the passivated furrows and the different metallizations have been superimposed by transparency.

DESCRIPTION OF THE PREFERRED EMBODIMENT

Figure 3:
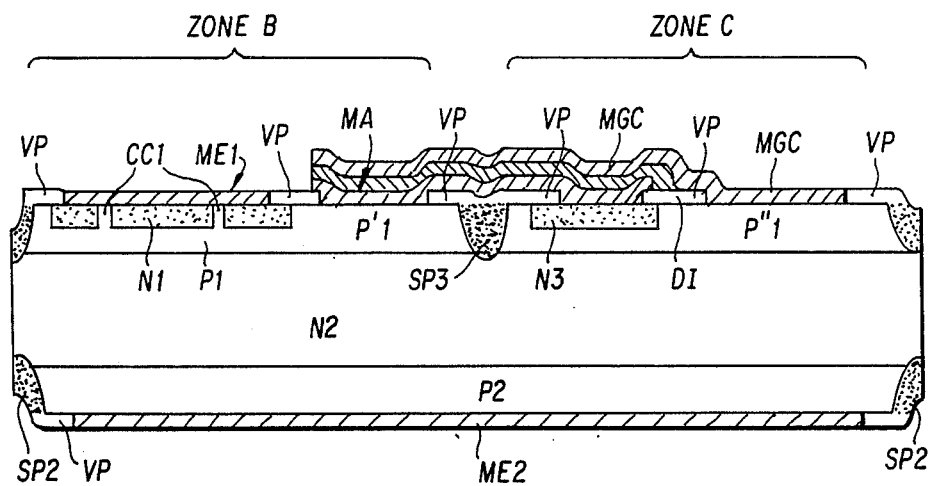
FIG. 3 shows a cross section of another embodiment of the thyristor of the invention.

The thyristor comprises conventionally the following elements:

a central layer N2 of N type conductivity forms the body of the semiconductor substrate;

a layer P1 of P type is formed on the upper side of layer N2 and covers the whole of layer N2 and a layer P2 of P type is formed on the lower side and also covers the whole of layer N2, a cathode region N1 is diffused on a part of the upper surface of the substrate and to a lower depth than the thickness of layer P2. This region is pierced with holes CC1 through which layer P1 rises to the surface of the substrate; these so-called emitter short circuit holes are known per se; they improve the triggering homogeneity of the thyristor; it will be noted that the sensitive thyristors are as a rule deprived of such holes for they impair the sensitivity; here some are provided for the structure of the invention allows these short circuit holes to be provided without impairing the sensitivity of the thyristor; thus a better striking homogeneity is obtained with good triggering sensitivity, an anode metallization ME2 covers the major part of the lower surface of the substrate; it is therefore in contact with the layer P2, a cathode metallization ME1 covers the cathode region N1 including the short circuit holes CC1; it does not extend over the whole of the upper surface of the substrate, a peripheral furrow SP2 filled with a passivation substance (glass) surrounds the substrate over the whole periphery of the lower surface; its depth is greater than that of the layer P2 and it therefore intersects the junction between layers P2 abd N2 for improving the reverse voltage resistance of this junction.

similarly, a peripheral furrow SP1 filled with a passivation substance (glass) surrounds the substrate over the whole of the periphery of the upper surface; its depth is greater than that of layer P1 and it therefore intersects the junction between layers P1 and N2 for improving the reverse voltage resistance of this junction .

In FIG. 2, it will be noted that the extent of the N type regions (N1 particularly) diffused in the P1 layer is constellated with small dots; the trace of the passivated furrows (SP1 particularly) is cross-hatched; the metallizations (ME1 particularly) are obliquely hatched; the parts which are neither cross-hatched nor dotted are in fact zones where the P1 layer is flush with the upper surface; finally, parts which are neither obliquely hatched nor cross-hatched (whether they are dotted or not) are parts covered with a passivation glass VP which is provided at certain places outside the furrows (particularly over the whole of the contour where the junction between the regions N1 and P1 rises to the surface.

In FIG. 2, the contour of region N1 is designated by CN1, that of the metallization ME1 by CME1.

The features of the sensitive thyristor of the invention are the following (in addition to the short circuit holes which as has been mentioned were absent in known sensitive thyristors):

The layer P1 of P type is divided into two zones by an additional furrow SP3 filled with a passivation substance and formed at the same time as furrow SP1; these two zones are a zone B(on the left in FIG. 1) and a zone C (on the right in FIG. 1). at the top and at the right in FIG. 2.

The first zone includes the whole of the cathode region N1 with its short circuit holes, the whole of the cathode metallisation ME1 and it comprises in addition a small portion of region P1 designated by P'1 in the figures which portion is flush with the upper surface of the substrate and which is not covered by the cathode metallization ME1.

This small portion P'1 is partly directly covered by an auxiliary metallization MA separated from the cathode metallization ME1 and partly covered by passivation glass VP; the contour of the auxiliary metallization MA is designated by CMA in FIG. 2; the contour of the contact region between the metallization MA and region P'1 is designated by CCMA1, the auxiliary metallization extending in fact not only over this contact region but also above the passivation glass VP which surrounds it and even above the passivated furrow SP3 and beyond.

The second zone of the P type layer, zone C, on the other side of the additional furrow SP3 has a smaller area than the first zone.

This second zone includes a portion of the P type region flush with the upper surface of the substrate, designated by P"1 partly covered by a gate metallization MG and partly by passivation glass VP. The contour of the gate metallization is designated by CMG in FIG. 2., On the other hand, the second zone C also includes an auxiliary region N3 of N type, diffused in the zone C but preferably not adjacent the passivated furrows; this region N3 is in the vicinity of the region P'1 of zone B it is only separated therefrom by the furrow SP3 and by a small part of region P"1 flush with the surface and covered with the passivation glass. The contour of region N3 is designated by CN3 in FIG. 2.

In the middle of region N3 an opening is provided in the passivation glass, which opening is covered by a metallization which is a part of the auxiliary metallization MA. In fact, this metallization MA extends not only into the zone B but it crosses the furrow SP3 and goes into zone C until it contacts the region N3 while remaining isolated (by the passivation glass) from the layer P"1 of zone C. IN FIG. 2 the contour of the contact opening above region N3 is designated by C3MA2.

The thyristor operates in the following way: zone C forms a sensitive thyristor whose triggering causes triggering the main thyristor of zone B. But this sensitive thyristor of zone C is not liable to premature triggering under the effect of gradients dV/dt or under the effect of the temperature. In fact, the emitter (cathode)N3 of the sensitive thyristor situated in zone C may be formed with a very small width which will make particularly efficient the effect of external decoupling by means of a resistance and/or capacity placed between gate and cathode. This very narrow cathode raises however no problem during assembly since the metallization MA, formed by deposition and photolithographic etching, has not been connected to an external terminal like the other metallizations. The power stage (zone B), of conventional design, itself has very good immunity thanks to the judiciously distributed short circuit holes CC1. Since it does not need to be interdigitated it will raise no problem during assembly.

The structure described above can advantageously be used to implement a variation of the invention illustrated in FIG. 3, through which the overall immunity of the structure to dV/dt parasites is enhanced. This enhancement is obtained by integrating a capacity between the gate of the sensitive (auxiliary) thyristor of zone C and that of the main thyristor of zone B.

For this purpose, the metallization MA serves as the electrode of the capacity. The capacity is implemented by depositing an inorganic dielectric at low temperature by the LPCVD of PECVD (Low Pressure Chemical Vapor Deposition or Plasma Enhanced Chemical Vapor Deposition) techniques or by depositing an organic dielectric such as a polyimide. The thickness of the dielectric DI is chosen so that the value of the capacity is close to a value equivalent to that of the P"N2 junction capacity multiplied by the gain $\beta$ of the transistor consisting of the P"1/N2/P2 layers.

The second electrode of the capacity is then implemented by causing the gate metallization MG (MGC on FIG. 3) to extend above the dielectric DI.

This capacity acts as a shunt between the two gates in the presence of dV/dt parasitic current which is injected directly into the gate of the main (power) thyristor (zone B) without triggering the thyristor. As explained above, the presence of shunts CCI considerably impairs the sensitivity of the thyristor. Because of this, a structure with enhanced immunity to dV/dt parasites is obtained: the presence of the capacity prevents the parasitic currents from being injected into the gate of the auxiliary (sensitive) thyristor, with a risk of triggering the auxiliary (sensitive) thyristor, and consequently the power (main) thyristor; however these parasitic currents are not sufficient to trigger the power thyristor.

In a variant not shown, the thyristor is formed with a planar type structure, that is to say that layer P1, instead of being diffused over the whole surface of the substrate is diffused locally. In this case, the passivated furrow SP3, at which the junction between the region P1 and the region N2 stops, is replaced by an N type semiconductor region covered with an isolating passivation layer. This N type region is an uprise of the region of substrate N2 which goes up to the upper surface and which is bordered by the edges of the region P1 of zone B on one side and the edges of region P1 of zone C on the other side. The substrate uprise has the same contour as furrow SP3; the auxiliary metallization MA passes above this uprise and it is isolated therefrom by the isolating passivation layer.

Finally, the two embodiments may be used in the case of a phototrippable thyristor, i.e. a thyristor which is not tripped by a gate current but by an illumination. Even in this case, a gate metallization may be kept for the connection of external resistances between gate and cathode.

What is claimed is:

1. A thyristor which is sensitive to triggering by a gate current and which is insensitive to triggering by a voltage gradient dV/dt, comprising a semiconductor substrate having a rear face covered with an anode metallization and a front face with a cathode metallization and a gate metallization, the thyristor having under the metallization of the front face a semiconductor layer of P type occupying the whole of the surface of the substrate, and a cathode region of N type being locally formed in the P type layer, wherein the P type layer is divided into two zones separated by a furrow filled with a passivation substance, a first zone containing on the one hand the whole of the cathode region and on the other hand a first P layer portion flush with the surface of the substrate and adjacent the furrow, and a second zone containing on the one hand an auxiliary region of N type formed in the P type layer and on the other hand a second P type layer portion flush with the surface, the gate metallization covering at least partially the second P layer portion in a corner of the second zone away from the auxiliary region of N type, the cathode metallization covering the cathode region without covering the first P layer portion, and an auxiliary metallization being provided, separate from the other metallizations, this metallization covering on the other hand at least partially the first P type layer portion and on the other hand at least partially the N type auxiliary region, said second zone occupying a substantially lesser surface of said front face than said first zone, said auxiliary region of N type formed in said second zone forming an N emitter of an auxiliary thyristor of which the second P type layer portion in the second zone serves as a gate, wherein triggering of said gate of said auxiliary thyristor results in conduction of said auxiliary thyristor and triggering of a main thyristor including the cathode region of N type formed in said first zone by means of the auxiliary metallization connecting the first P type layer portion of the first zone to the N emitter of the auxiliary thyristor of the second zone, said first P type layer portion serving as a gate of said main thyristor, said thyristor further comprising a capacity provided between the gate of said auxiliary thyristor and the gate of said main thyristor, said auxiliary metallization serving as an electrode of said capacity, said capacity comprising a dielectric layer deposited over said auxiliary metallization and said gate metallization extending over said dielectric layer.

2. The sensitive thyristor as claimed in claim 1 wherein the auxiliary region is not adjacent the said furrow.

3. The sensitive thyristor as claimed in claim 1, wherein the cathode region has short circuit holes through which the P type layer rises to the upper surface of the substrate.

4. The sensitive thyristor as claimed in claim 1, wherein the auxiliary metallization is a continuous layer passing above the passivated furrow where this furrow extends between the first P layer portion and the auxiliary region.

5. A thyristor which is sensitive to triggering by a gate current and which is insensitive to triggering by a voltage gradient dV/dt, including a semiconductor substrate having a rear face covered with an anode metallization and a front face with a cathode metallization and a gate metallization, the thyristor having under the metallization of the front face a P type semiconductor layer formed locally in the surface of the substrate, and on N type cathode region being locally formed in the P type layer, wherein the P type layer is divided into two main zones separated by an N type substrate region rising to the surface and covered by an isolating passivation layer, these two zones being respectively a first zone containing on the one hand the whole of the cathode region and on the other hand a first P layer portion flush with the surface of the substrate and adjacent the region of the substrate rising to the surface, and a second zone containing on the one hand an auxiliary N type region formed in the P type layer and on the other hand a second P type layer portion flush with the surface, the gate metallization covering at least partially the second P layer portion in a corner of the second zone away from the auxiliary region of N type, the cathode metallization covering the cathode region without covering the first P layer portion and an auxiliary metallization being provided, separate from the other metallizations, this metallization covering on the other hand at least partially the first P type layer portion and on the other at least partially the N type auxiliary region, said second zone occupying a substantially lesser surface of said front face than said first zone, said auxiliary region of N type formed in said second zone forming an N emitter of an auxiliary thyristor of which the second P type layer portion in the second zone serves as a gate, wherein triggering of said gate of said auxiliary thyristor results in conduction of said auxiliary thyristor and triggering of a main thyristor including the cathode region of N type formed in said first zone by means of the auxiliary metallization connecting the first P type layer portion of the first zone to the N emitter of the auxiliary thyristor of the second zone, said first P type layer portion serving as a gate of said main thyristor, said thyristor further comprising a capacity provided between the gate of said auxiliary thyristor and the gate of said main thyristor, said auxiliary metallization serving as an electrode of said capacity, said capacity comprising a dielectric layer deposited over said auxiliary metallization and said gate metallization extending over said dielectric layer.

6. The sensitive thyristor as claimed in claim 5, wherein the auxiliary region does not join the N substrate region rising to the surface.

7. The sensitive thyristor as claimed in claim 5, wherein the cathode region comprises short circuit holes through which the P type layer rises to the upper surface of the substrate.

8. The sensitive thyristor as claimed in claim 5, wherein the auxiliary metallization is a continuous layer passing above the isolating passivation layer between the first P layer portion and the auxiliary region.

9. The sensitive thyristor as claimed in one of the preceding claims, wherein the thyristor is phototrippable.

* * * * *